(12) United States Patent
Jung et al.

(10) Patent No.: US 7,863,758 B2
(45) Date of Patent: Jan. 4, 2011

(54) ADHESIVE FILM COMPOSITION, ASSOCIATED DICING DIE BONDING FILM, AND DIE PACKAGE

(75) Inventors: Ki Sung Jung, Gunpo-si (KR); Wan Jung Kim, Seoul (KR); Yong Woo Hong, Suwon-si (KR); Chang Bum Chung, Yongin-si (KR); Chul Jeong, Seoul (KR); Ah Ram Pyun, Seoul (KR); Su Mi Im, Gunpo-si (KR); Kyoung Jin Ha, Seoul (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 291 days.

(21) Appl. No.: 12/000,070

(22) Filed: Dec. 7, 2007

(65) Prior Publication Data

US 2008/0145668 A1    Jun. 19, 2008

(30) Foreign Application Priority Data

Dec. 13, 2006  (KR) .................... 10-2006-0127293

(51) Int. Cl.
*H01L 23/488* (2006.01)
*B32B 27/36* (2006.01)
*B32B 27/38* (2006.01)
*C08L 63/00* (2006.01)
*C08L 67/02* (2006.01)

(52) U.S. Cl. .................. 257/783; 156/327; 156/330; 428/355 EP; 428/413; 428/414; 428/480; 523/400; 525/438; 525/533

(58) Field of Classification Search ............... 523/400; 525/438, 449, 523, 524, 533; 428/343, 355 R, 428/355 EP, 413, 414, 416, 418, 480; 156/327, 156/330; 257/782, 783
See application file for complete search history.

(56) References Cited

U.S. PATENT DOCUMENTS 5,183,592 A * 2/1993 Ichimura et al. ............ 252/512
7,008,981 B2 * 3/2006 Liu et al. .................... 523/442

* cited by examiner

*Primary Examiner*—Michael J Feely
(74) *Attorney, Agent, or Firm*—Lee & Morse, P.C.

(57) ABSTRACT

An adhesive film composition includes a polyester-based thermoplastic resin, an elastomer resin containing at least one of a hydroxyl group, a carboxyl group, or an epoxy group, an epoxy resin, a phenol curing agent, one or more of a latent catalytic curing agent or a curing catalyst, a silane coupling agent, and a filler.

20 Claims, 5 Drawing Sheets

FIG. 2

(units in grams)

| Component | Product No. | Example 1-1 | Example 1-2 | Example 1-3 | Example 1-4 | Comparative Example 1 |
|---|---|---|---|---|---|---|
| Polyester thermoplastic resin | UE3320 | 4 | 8 | 15 | 23 | 0 |
| Carboxyl group and hydroxyl group containing elastomer resin | KLS1013 | 60 | 56 | 49 | 41 | 64 |
| Cresol novolac based epoxy resin | YDCN-500-90P | 11 | 11 | 11 | 11 | 11 |
| Cresol novolac and bipheny-based epoxy resin | CER-1020 | 10 | 10 | 10 | 10 | 10 |
| Biphenyl-based phenol curing agent | KPH-F4500 | 17 | 17 | 17 | 17 | 17 |
| Imidazole-based curing catalyst | 2P4MZ | 0.2 | 0.2 | 0.2 | 0.2 | 0.2 |
| Mercapto-silane coupling agent | KBM-803 | 0.5 | 0.5 | 0.5 | 0.5 | 0.5 |
| Epoxy silane coupling agent | KBM-303 | 0.5 | 0.5 | 0.5 | 0.5 | 0.5 |
| Amorphous silica | AEROSIL® R-972 | 14 | 14 | 14 | 14 | 14 |

FIG. 3

(units in grams)

| Component | Product No. | Example 2-1 | Example 2-2 | Example 2-3 | Example 2-4 | Comparative Example 2 |
|---|---|---|---|---|---|---|
| Polyester thermoplastic resin | AR2440 | 4 | 8 | 15 | 23 | 0 |
| Carboxyl group and hydroxyl group containing elastomer resin | SG-708-6 | 34 | 30 | 23 | 15 | 38 |
| Cresol novolac based epoxy resin | YDCN-500-5P | 11 | 11 | 11 | 11 | 11 |
| Cresol novolac and biphenyl-based epoxy resin | CER-1020 | 10 | 10 | 10 | 10 | 10 |
| Biphenyl-based phenol curing agent | KPH-F4500 | 15 | 15 | 15 | 15 | 15 |
| Xyloc-based latent curing agent | MEH-7800C | 5 | 5 | 5 | 5 | 5 |
| Mercapto-silane coupling agent | KBM-803 | 0.5 | 0.5 | 0.5 | 0.5 | 0.5 |
| Epoxy silane coupling agent | KBM-303 | 0.5 | 0.5 | 0.5 | 0.5 | 0.5 |
| Spherical silica filler | PLV-3 | 34 | 34 | 34 | 34 | 34 |

FIG. 4

| | Adhesive/PSA 180° Peel Strength before UV (dyne/mm) | Adhesive/PSA 180° Peel Strength after UV (dyne/mm) | Wafer/Adhesive 180° Peel Strength (dyne/mm) | Eta 60 °C [P x10$^6$] | Eta 100 °C [P x10$^6$] | Void Area after Die Attachment at 100°C (%) |
|---|---|---|---|---|---|---|
| Example 1-1 | 3300 | 1770 | 3800 | 1.8 - 2 | 1.4 - 1.7 | 40 |
| Example 1-2 | 3280 | 1660 | 4100 | 1.5 - 1.8 | 1.2 - 1.4 | 27 |
| Example 1-3 | 3160 | 1470 | 4800 | 1.3 - 1.6 | 1 - 1.3 | 8 |
| Example 1-4 | 3100 | 1350 | 5100 | 1 - 1.3 | 0.8 - 1.1 | 3 |
| Comparative Example 1 | 3370 | 2100 | 3600 | 0.2 - 0.23 | 2 - 2.3 | 45 |
| Example 2-1 | 3630 | 2430 | 3500 | 0.6 - 0.75 | 0.5 - 0.6 | 15 |
| Example 2-2 | 3580 | 2310 | 3900 | 0.45 - 0.6 | 0.2 - 0.3 | 7 |
| Example 2-3 | 3420 | 2170 | 4300 | 0.3 - 0.45 | 0.1 - 0.2 | 1 |
| Example 2-4 | 3340 | 2130 | 5000 | 0.15 - 0.3 | 0.05 - 0.1 | 0.5 |
| Comparative Example 2 | 3700 | 2560 | 3200 | 0.6 - 0.75 | 0.6 - 0.7 | 25 |

ADHESIVE FILM COMPOSITION, ASSOCIATED DICING DIE BONDING FILM, AND DIE PACKAGE

BACKGROUND OF THE INVENTION

1. Field of the Invention

Embodiments relate to an adhesive film composition and, more particularly, to an adhesive film composition that may be employed to form an adhesive film for die assembly and packaging.

2. Description of the Related Art

There has been increasing interest in using adhesive films for die, assembly and packaging, e.g., in semiconductor assembly and packaging. For example, an adhesive film may be employed as part of a dicing film, which may be used to fix a semiconductor wafer during a dicing operation in a semiconductor chip manufacturing process. A typical process of using an adhesive film for semiconductor assembly may include laminating the dicing film to a semiconductor wafer and then cutting the semiconductor wafer in a dicing process. A dicing process is a process of cutting a semiconductor wafer into individual semiconductor dies, i.e., chips. Following the dicing process, an expanding process, a pick-up process and die attaching process may be sequentially performed.

The application of adhesive films to semiconductor manufacturing may be extended by employing the adhesive film as part of a dicing die bonding film, which is an integrated film used for both dicing and die bonding, i.e., die attach. In such a process, however, a pick-up process may require that a die laminated with the adhesive layer be completely picked up, e.g., removed from a pressure sensitive adhesive (PSA) layer. Thus, the level of adhesion between the adhesive layer and the die may need to be high, in order to separate the die from the PSA layer. Further, the application of the adhesive film to a dicing die bonding film may demand greater reliability, e.g., increased tensile strength, of the adhesive film. Additionally, the quality of the interface between the adhesive film and the wafer and/or dies may be important. For example, if voids are formed at the interface of the adhesive film and the wafer and/or dies, the reliability of the resulting packaged dies may be reduced. Similarly, voids formed at the interface of the adhesive film and an underlying substrate, e.g., a printed circuit board (PCB), or another die or wafer, may impair reliability.

SUMMARY OF THE INVENTION

Embodiments are therefore directed to an adhesive film composition, an associated dicing die bonding film and a die package, which substantially overcome one or more of the problems due to the limitations and disadvantages of the related art.

It is therefore a feature of an embodiment to provide an adhesive film composition that may be used to form an adhesive film that is solid at room temperature and exhibits flowability at temperatures used during bonding of a die.

It is therefore another feature of an embodiment to provide a die package that includes the adhesive film.

At least one of the above and other features and advantages may be realized by providing an adhesive film composition, including a polyester-based thermoplastic resin, an elastomer resin containing at least one of a hydroxyl group, a carboxyl group, or an epoxy group, an epoxy resin, a phenol curing agent, at least one of a latent catalytic curing agent or a curing catalyst, a silane coupling agent, and a filler. The polyester-based thermoplastic resin may be a homopolymer or copolymer represented by the following Formula 1:

$R_1$ and $R_2$ may independently include a carbon chain of at least one carbon, $R_1$ and $R_2$ may independently be substituted or unsubstituted, and n may range from 1 to about 300. $R_1$ may be an oxalic group, a succinyl group, a terephthalic group, an isophthalic group, a naphthalene group, a diphenyl group, a diphenoxyethene group, a diphenylsulfone group, an alkyl group, a benzoic group, a cycloalkyl group, or a benzene group, $R_2$ may be an alkyl group, a naphthalene group, a hydroquinone group, a benzene group, or a phenyl group, and $R_1$ and $R_2$ may independently be substituted or unsubstituted. The polyester-based thermoplastic resin may have a softening point of about 0° C. to about 200° C., and may have a weight average molecular weight of about 200 to about 1,000,000. The polyester-based thermoplastic resin may have a softening point of about 30° C. to about 140° C.

The elastomer resin may have a weight average molecular weight ranging from about 500 to about 5,000,000. The epoxy resin may include one or more of a bisphenol-based epoxy, a phenol novolac-based epoxy, an o-cresol novolac-based epoxy, a multifunctional epoxy resin, an amine-based epoxy, a heterocyclic ring-containing epoxy, a substituted epoxy, a naphthol-based epoxy, or derivatives thereof. The phenol curing agent may include one or more of a phenol novolac-based resin, a xyloc-based resin, a bisphenol A-based novolac resin, or a cresol-based novolac resin. The composition may include the latent catalytic curing agent, and the latent catalytic curing agent may include a biphenyl-based phenol curing agent or a xylok-based phenol curing agent, and a catalyst represented by Formula 2 or 3:

The composition may include the curing catalyst, and the curing catalyst may include one or more of a melamine-based curing catalyst, an imidazole-based curing catalyst, or a phenol-based curing catalyst. The silane coupling agent may include one or more of an epoxy-containing silane or a mercapto-containing silane. The filler may have a size ranging from about 5 nm to about 10 μm.

Based on a total amount of the adhesive film composition exclusive of any solvent, the polyester-based thermoplastic resin may be included in an amount of about 1 to about 50 parts by weight, the elastomer resin may be included in an amount of about 5 to about 75 parts by weight, the epoxy resin may be included in an amount of about 3 to about 20 parts by weight, the phenol curing agent may be included in an amount of about 3 to about 40 parts by weight, the latent catalytic curing agent may be included in an amount of about 3 to about 20 parts by weight, the silane coupling agent may be included in an amount of about 0.01 to about 10 parts by weight, and the filler may be included in an amount of 0.1 to 60 parts by weight. Based on a total amount of the adhesive film composition exclusive of any solvent, the polyester-based thermoplastic resin may be included in an amount of about 1 to about 50 parts by weight, the elastomer resin may be included in an amount of about 5 to about 75 parts by weight, the epoxy resin may be included in an amount of about 3 to about 20 parts by weight, the phenol curing agent may be included in an amount of about 3 to about 40 parts by weight, the curing catalyst may be included in an amount of about 0.01 to about 5 parts by weight, the silane coupling agent may be included in an amount of about 0.01 to about 10 parts by weight, and the filler may be included in an amount of 0.1 to 60 parts by weight.

The composition may further include about 5 to about 85 parts by weight of an organic solvent. The composition may further include about 0.01 to about 5 parts by weight of an ion-capturing agent, wherein the ion-capturing agent includes one or more of a triazine thiol compound, a zirconium-based compound, an antimony bismuth-based compound, or a magnesium aluminum-based compound.

At least one of the above and other features and advantages may also be realized by providing an adhesive film, including a partially solidified mixture that includes a polyester-based thermoplastic resin, an elastomer resin containing at least one of a hydroxyl group, a carboxyl group, or an epoxy group, an epoxy resin, a phenol curing agent, at least one of a latent catalytic curing agent or a curing catalyst, a silane coupling agent, and a filler.

At least one of the above and other features and advantages may also be realized by providing a dicing die-bonding film, including a dicing film, an adhesive film, and a pressure sensitive adhesive layer. The pressure sensitive adhesive layer may be disposed between the adhesive film and the dicing film, and the adhesive film may include a partially solidified mixture having a polyester-based thermoplastic resin, an elastomer resin containing at least one of a hydroxyl group, a carboxyl group, or an epoxy group, an epoxy resin, a phenol curing agent, at least one of a latent catalytic curing agent or a curing catalyst, a silane coupling agent, and a filler.

At least one of the above and other features and advantages may also be realized by providing a die package, including a die, an adhesive film, and a substrate, the adhesive film being disposed between the die and the substrate. The adhesive film may include a solidified mixture having a polyester-based thermoplastic resin, an elastomer resin containing at least one of a hydroxyl group, a carboxyl group, or an epoxy group, an epoxy resin, a phenol curing agent, at least one of a latent catalytic curing agent or a curing catalyst, a silane coupling agent, and a filler.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Korean Patent Application No. 10-2006-0127293, filed on Dec. 13, 2006, in the Korean Intellectual Property Office, and entitled: "Adhesive Film Composition for Semiconductor Assembly and Adhesive Film Prepared Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B and, C together, whereas the expression "either A, B, or C" means one of A alone, B alone, and C alone, and does not mean any of both A and B together; both A and C together; both B and C together; and all three of A, B and C together.

As used herein, the terms "a" and "an" are open terms that may be used in conjunction with singular items or with plural items. For example, the term "a curing agent" may represent a single compound, e.g., tetraphenylphosphonium tetraphenylborate, or multiple compounds in combination, e.g., tetraphenylphosphonium tetraphenylborate mixed with a triphenylphosphine-1,4-benzoquinone adduct.

As used herein, molecular weights of polymeric materials are weight average molecular weights, unless otherwise indicated.

As used herein, the language "parts by weight, based on the total amount of the adhesive film composition" is exclusive of solvent, unless otherwise indicated. That is, as used herein, the point of reference "the total amount of the adhesive film composition" does not include solvent. For example, where a composition is composed of two components A and B, with A present in 35 parts by weight and B present in 65 parts by weight, based on the total amount of the adhesive film composition, the addition of 10 parts by weight of solvent to the composition would result in the composition continuing to have 35 parts by weight A and 65 parts by weight B, based on the total amount of the adhesive film composition.

Figure 1A:
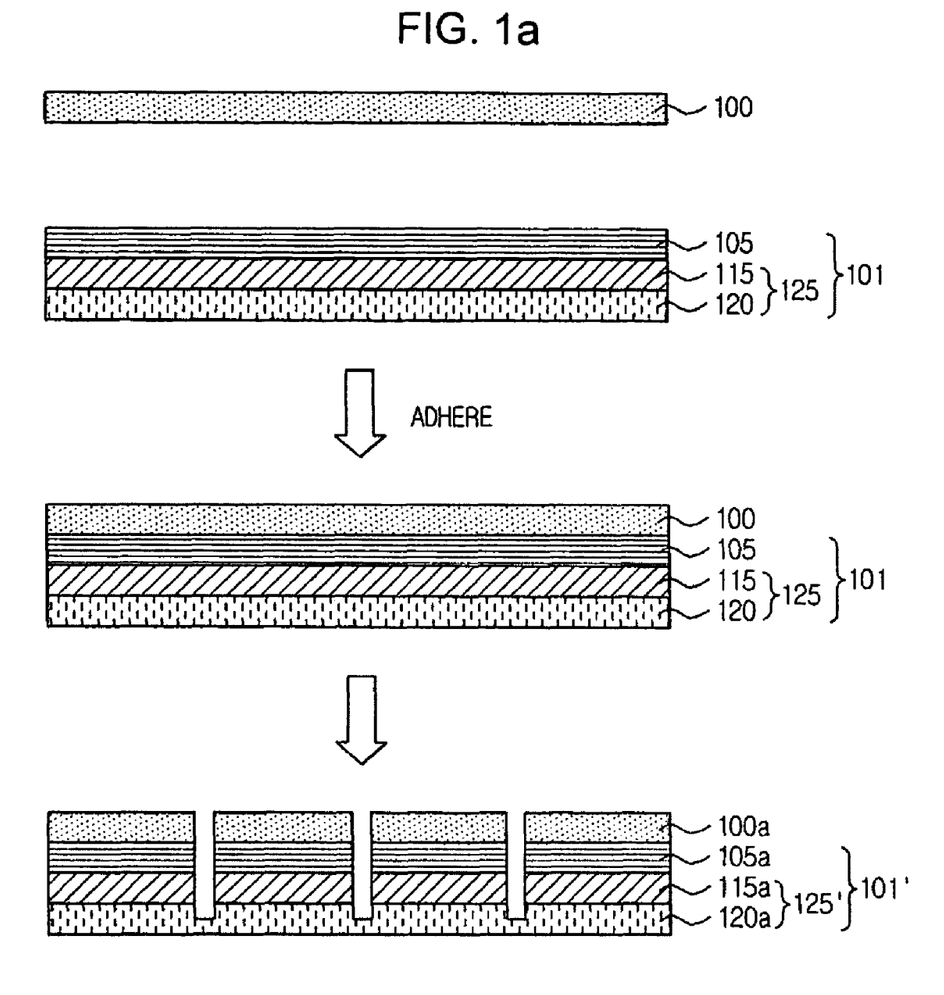
FIGS. 1A and 1B illustrate cross-sectional views of stages in a method of packaging a die according to an embodiment.
Figure 1B:
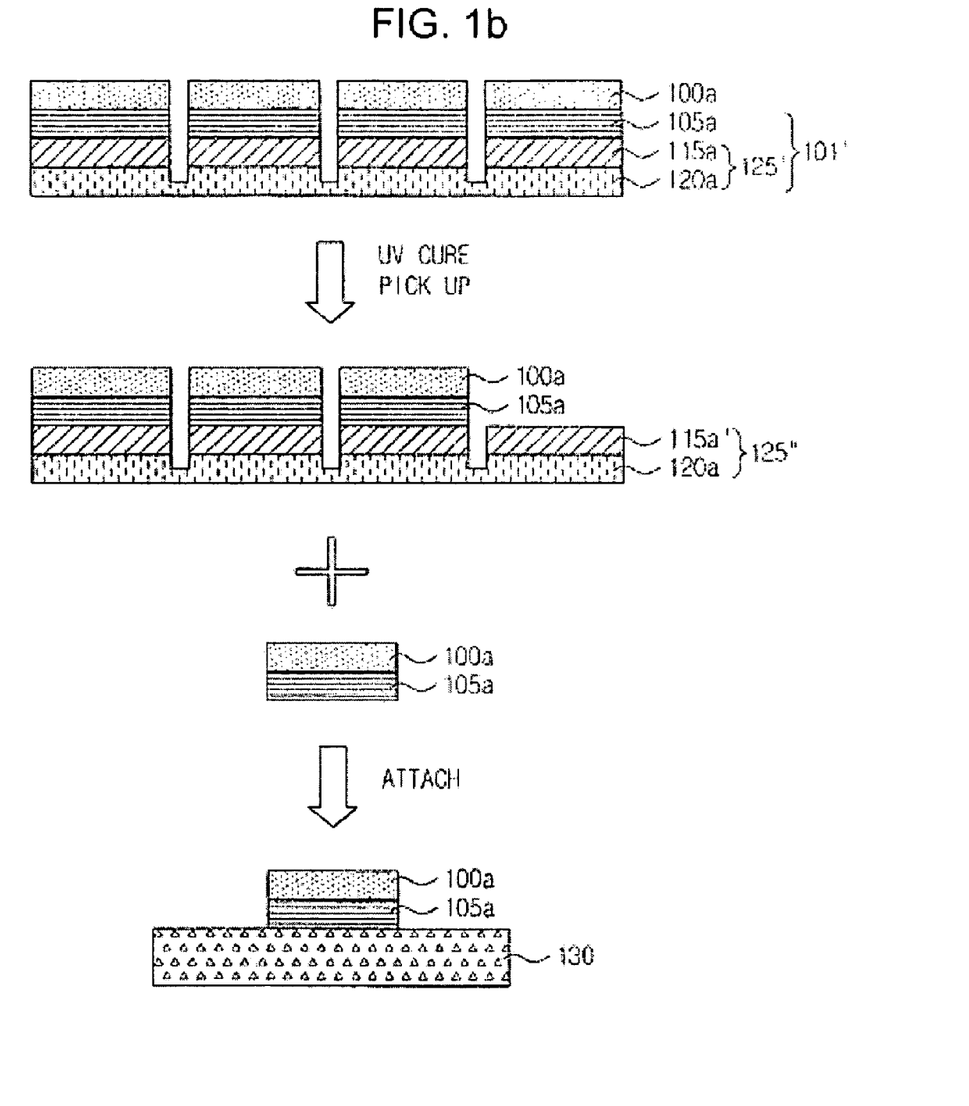

FIGS. 1A and 1B illustrate cross-sectional views of stages in an example method of packaging a die, e.g., a semiconductor device, according to an embodiment, wherein a wafer is diced and an individual die, i.e., a chip, is attached to a substrate using a dicing die bonding film. In the following illustrative example, a process of packaging a semiconductor die will be described. However, other types of chips or dies may be similarly packaged, e.g., optical or electro-optical devices, MEMS devices, etc.

Referring to FIGS. 1A and 1B, a semiconductor wafer 100 may have a plurality of devices fabricated thereon, e.g., memory devices, microprocessors, etc. In order to package the devices, it may be desirable to separate the semiconductor wafer 100 along scribe lines so as to form a plurality of dies 100a. This dicing process may involve laminating the entire, un-diced wafer 100 with a dicing die bonding film 101 that includes a dicing film 125 and an intermediate adhesive layer 105. The adhesive layer 105 of the dicing die bonding film 101 may be formed using an adhesive film composition according to an embodiment, details of which are described below.

The dicing film 125 may include a PSA layer 115 and a base film 120. The PSA layer 115 may be, e.g., a non-curing film or a UV-curing film. The base film 120 may be, e.g., a vinylchloride film such as PVC or a polyolefin. In an implementation, the dicing film 125 may be fabricated by laminating the PSA layer 115 with the base film 120. The dicing die bonding film 101 may be attached to the semiconductor wafer 100 at the adhesive film 105, and the PSA layer 115 may face and be attached to the adhesive layer 105.

As described above, a wafer assembly may be formed having the un-diced wafer 100 bonded to the dicing die bonding film 101 that includes the adhesive layer 105 according to an embodiment. A dicing process may then be performed to separate the wafer 100 into a plurality of dies 100a. The dicing process may also separate the adhesive layer 105 into parts 105a corresponding to the individual dies 100a, as indicated by the separated adhesive layer 105a of the post-dicing dicing die bonding film 101'. Similarly, the dicing film 125 may be partially separated to form dicing film 125' having the PSA layer 115 separated into parts 115a and the base film 120 partially separated into parts 120a. Throughout the dicing process, the wafer 100/dies 100a may remain adhered to the dicing die bonding film 101/101'.

Referring to FIG. 1B, an individual die 100a may be removed from the dicing die bonding film 101'. This process may be enabled by exposing the assembly to ultraviolet (UV) light, which may cure the PSA layer 115a to yield a dicing film 125" having a cured PSA layer 115a', the cured PSA layer 115a' having a reduced level of adhesion. In particular, the cured PSA layer 115a' may have a significantly lower adhesion to the diced adhesive layer 105a, such that, during pick up of the individual die 100a, the diced adhesive layer 105a remains adhered to the individual die 100a and releases from the cured PSA layer 115a'. Thus, the pick up process may remove the individual die 100a and its associated diced adhesive layer 105a, which may then be mounted to a substrate 130, with the diced adhesive layer 105a facing and in contact with the substrate 130, such that the individual die 100a is attached to the substrate 130. Further processes, e.g., wiring, encapsulation, etc., may also be performed. The adhesive layer 105 may be formed using an adhesive film composition according to an embodiment, details of which will now be described.

An embodiment relates to an adhesive film composition for die assembly that includes a polyester-based thermoplastic resin. The adhesive film composition may include the polyester-based thermoplastic resin, an elastomer resin containing, e.g., one or more of a hydroxyl group, a carboxyl group or an epoxy group, an epoxy resin, a phenol curing agent, one or more of a latent catalytic curing agent or a curing catalyst, a silane coupling agent, and a filler.

The adhesive film may be a solid at room temperature, which may favorably decrease the adhesive force of the adhesive film with respect to a pressure-sensitive adhesive (PSA) layer. This may facilitate pick-up during a die pick-up process. Furthermore, the adhesive film may be exhibit a desirable level of flowability at predetermined bonding temperatures in a die attachment process, which may reduce or eliminate the generation of voids at an interface between the adhesive film and, e.g., a printed circuit board (PCB), wafer, etc. This may provide high reliability in the packaged device.

The polyester-based thermoplastic resin may aid in forming the adhesive film and in enhancing interfacial adhesion. In an implementation, the polyester-based thermoplastic resin may have a softening point of about 0° C. to about 200° C., preferably 30° C. to about 140° C., and may have a weight average molecular weight ranging from about 200 to about 1,000,000, which may help the resultant adhesive film to maintain a solid state at room temperature. This may help decrease adhesion with respect to a PSA layer in a die pick-up process, which may reduce die pick-up errors and improve die pick-up yields. Further, the adhesive film including the polyester-based thermoplastic resin may exhibit a desired level of flowability at predetermined pre-bonding temperatures in a die attachment process, which may diminish the generation of interfacial voids, e.g., voids between the adhesive film and a substrate.

In an implementation, the polyester-based thermoplastic resin may include a compound represented by Formula 1 below:

(1)

In Formula 1, $R_1$ may include a carbon chain of at least one carbon bonded to the adjacent carbonyl groups. $R_1$ may be, e.g., an oxalic group from oxalic acid, a succinyl group from succinic acid, a terephthalic group from terephthalic acid, an isophthalic group from isophthalic acid, a naphthalene group from 2,6-naphthalene dicarboxylic acid, 2,7-naphthalene dicarboxylic acid, 1,5-naphthalene dicarboxylic acid, etc., a diphenyl group from diphenyl dicarboxylic acid, diphenylether dicarboxylic acid, diphenylethane dicarboxylic acid, etc., a diphenoxyethene group from diphenoxyethene-4,4-dicarboxylic acid, a diphenylsulfone group from diphenylsulfone dicarboxylic acid, an alkyl group from adipic acid, sebacic acid, hexanedioic acid, butenedioic acid, glycolic acid, etc., a benzoic group from p-oxybenzoic acid, p-oxyethoxybenzoic acid, etc., a cycloalkyl group from cyclohexane dicarboxylic acid, or a benzene group from trimellitic acid, trimesic acid, pyromellitic acid, etc. Such groups may be substituted or unsubstituted. Further, such groups may be used alone or in combination with one or more other groups, i.e., the polyester-based thermoplastic resin may be a homopolymer, or a copolymer of groups such as the $R_1$ groups described above.

In Formula 1, $R_2$ may include a carbon chain of at least one carbon bonded to the adjacent ester and hydroxyl or carbonyl groups. $R_2$ may be, e.g., an alkyl group from ethylene glycol, propylene glycol, pentaerythritol, isobutylene glycol, butanediol, neopentyl glycol, etc., a naphthalene group from 2,6-dihydroxynaphthalene, a cycloalkyl group from cyclohexanediol, octahydro-4,7-methano-1H-indene-dimethanol, naphthalene diol, etc., a hydroquinone group from hydroquinone, a benzene group from resorcinol, a phenyl group from dihydroxyphenyl, dihydroxyphenyl ester, 2,2-bis(4-hydroxyphenyl)propane, diethoxybisphenol A, etc., or an alkoxy-substituted or halogen-substituted compound having two or more hydroxyl groups. Such groups may be substituted or unsubstituted, and each of them may be used alone or in combination with one or more other groups. In Formula 1, n may be 1 to about 300.

The compound represented by Formula 1 may be polymerized from a first compound, which may have two or more carboxyl groups before polymerization and may include $R_1$, and a second compound, which may have a diol structure before polymerization and may include $R_2$. The first and second compounds may be polymerized to produce the compound represented by Formula 1 as set forth in the following polymerization schematic:

One or both of the first and second compounds may be substituted, e.g., with one or more of a phenyl group, a siloxane group, or an alkyl group. Such substitution, when employed, should preferably not be so extensive that it significantly affects the overall polymerization reaction. The first compound may be, e.g., oxalic acid, succinic acid, terephthalic acid, isophthalic acid, 2,6-naphthalene dicarboxylic acid, 2,7-naphthalene dicarboxylic acid, 1,5-naphthalene dicarboxylic acid, diphenyl dicarboxylic acid, diphenylether dicarboxylic acid, diphenylethane dicarboxylic acid, diphenoxyethene-4,4-dicarboxylic acid, diphenylsulfone dicarboxylic acid, adipic acid, sebacic acid, hexanedioic acid, butenedioic acid, glycolic acid, p-oxybenzoic acid, p-oxyethoxybenzoic acid, cyclohexane dicarboxylic acid, trimellitic acid, trimesic acid, pyromellitic acid, etc. Such groups may be substituted or unsubstituted, and each of them may be used alone or in combination with one or more other groups.

The second compound may be, e.g., ethylene glycol, propylene glycol, pentaerythritol, isobutylene glycol, butanediol, neopentyl glycol, 2,6-dihydroxynaphthalene, cyclohexanediol, octahydro-4,7-methano-1H-indene-dimethanol, naphthalene diol, hydroquinone, resorcinol, dihydroxyphenyl, dihydroxyphenyl ester, 2,2-bis(4-hydroxyphenyl)propane, diethoxybisphenol A, an alkoxy-substituted or halogen-substituted compound having two or more hydroxyl groups, etc. Such groups may be substituted or unsubstituted, and each of them may be used alone or in combination with one or more other groups.

The polyester-based thermoplastic resin, such as the compound represented by Formula 1, may impart flowability and adhesion at predetermined pre-bonding temperatures of the polyester resin. In an implementation, the polyester-based thermoplastic resin may have predetermined material properties such that the viscosity thereof changes significantly depending on temperature, as will be described in additional detail below.

In an implementation, the polyester-based thermoplastic resin may be used in an amount of about 1 to about 50 parts by weight, and preferably about 10 to about 30 parts by weight, based on the total amount of the adhesive film composition. The use of about 50 parts by weight or less may avoid undue reductions in the tensile strength of the film, and may simplify application of the film.

The elastomer resin may be a rubber, film-forming component, e.g., a rubber containing a hydroxyl group, a carboxyl group or an epoxy group. The elastomer resin may have a weight average molecular weight ranging from about 500 to about 5,000,000. Examples of the elastomer resin include acrylonitrile-based, butadiene-based, styrene-based, acryl-based, isoprene-based, ethylene-based, propylene-based, polyurethane-based and silicone-based elastomers.

The elastomer resin may be used in an amount of about 5 to about 75 parts by weight, based on the total amount of the adhesive film composition. The use of about 5 parts by weight or more may ease film formation. The use of about 75 parts by weight or less may help avoid undue reductions in adhesion and, thus, improve reliability.

The epoxy resin may be any suitable epoxy resin that exhibits curing and adhesion functions. An epoxy in a solid state or in a state close to a solid may be desirable for shaping the adhesive film. An epoxy resin having one or more functional groups may be particularly useful.

Examples of epoxy resins in the solid state include bisphenol-based epoxies, phenol novolac-based epoxies, o-cresol novolac-based epoxies, polyfunctional epoxies, amine-based epoxies, heterocyclic ring-containing epoxies, substituted epoxies, naphthol-based epoxies, and derivatives thereof.

Exemplary commercially-manufactured products of the above-described components for the epoxy resin include the following. For the bisphenol-based epoxy, examples include YD-017H, YD-020, YD020-L, YD-014, YD-014ER, YD-013K, YD-019K, YD-019, YD-017R, YD-017, YD-012, YD-011H, YD-011S, YD-011, YDF-2004, and YDF-2001, all made by Kukdo Chemical Co., Ltd. (Korea). For the phenol novolac-based epoxy, examples include EPIKOTE™ 152 and EPIKOTE™ 154, both made by Hexion Specialty Chemicals, Inc. (U.S.A.) (formerly Yuka-Shell Epoxy Co., Ltd., and Resolution Performance Products, LLC), EPPN-201, made by manufactured by Nippon Kayaku Co., Ltd. (Japan), D.E.N.™ 438, made by Dow Chemical Co. (U.S.A.), and YDPN-641, YDPN-638A80, YDPN-638, YDPN-637, YDPN-644, and YDPN-631, all made by Kukdo Chemical Co., Ltd. (Korea). For the o-cresol novolac-based epoxy, examples include YDCN-500-1P, YDCN-500-2P, YDCN-500-4P, YDCN-500-5P, YDCN-500-7P, YDCN-500-8P, YDCN-500-10P, YDCN-500-80P, YDCN-500-80PCA60, YDCN-500-80PBC60, YDCN-500-90P, and YDCN-500-90PA75, all made by Kukdo Chemical Co., Ltd. (Korea), EOCN-102S, EOCN-103S, EOCN-104S, EOCN-1012, EOCN-1025, and EOCN-1027, all made by Nippon Kayaku Co., Ltd. (Japan), YDCN-701, YDCN-702, YDCN-703, and YDCN-704, all made by Tohto Kasei Co., Ltd. (Japan), and EPICLON® N-665-EXP, made by Dainippon Ink & Chemicals, Inc. (DIC Corp.) (Japan). For the bisphenol-based novolac epoxy, examples include KBPN-110, KBPN-120, and KBPN-115, all made by Kukdo Chemical Co., Ltd. (Korea). For the polyfunctional epoxy resin, examples include EPON™ 1031S, made by Hexion Specialty Chemicals, Inc. (U.S.A.) (formerly Yuka-Shell Epoxy Co., Ltd., and Resolution Performance Products, LLC), Araldite® 0163, made by Ciba Specialty Chemicals (Switzerland), DENACOL® EX-611, DENACOL® EX-614, DENACOL® EX-614B, DENACOL® EX-622, DENACOL® EX-512, DENACOL® EX-521, DENACOL® EX-421, DENACOL® EX-411, and DENACOL® EX-321, all made by Nagase ChemteX Corp. (formerly Nagase Chemicals Ltd.) (Japan), and EP-5200R, KD-1012, EP-5100R, KD-1011, KDT-4400A70, KDT-4400, YH-434L, YH-434, and YH-300, all made by Kukdo Chemical Co., Ltd. (Korea). For the amine-based epoxy resin, examples include EPIKOTE™ 604, made by Hexion Specialty Chemicals, Inc. (U.S.A.), YH-434, made by Tohto Kasei Co., Ltd. (Japan), TETRAD® X® and TETRAD® C, both made by Mitsubishi Gas Chemical Co., Inc. (Japan), and ELM-120, made by Sumitomo Chemical Co., Ltd. (Japan). An example of the heterocyclic ring-containing epoxy resin is Araldite® PT-810. For the substituted epoxy resin, examples include ERL-4234, ERL-4299, ERL-4221, and ERL-4206, all made by Union Carbide Corp. For the naphthol-based epoxy, examples include EPICLON® HP-4032, EPICLON® HP-4032D, EPICLON® HP-4700, and EPICLON®4701, made by Dainippon Ink & Chemicals, Inc. (DIC Corp.) (Japan). The above-described example commercially-manufactured products for the epoxy resin may be used alone or in mixtures of two or more.

The epoxy resin may be used in an amount of about 3 to about 20 parts by weight, based on the total amount of the adhesive film. The use of about 3 parts by weight or more may enhance reliability due to a sufficient curing fraction. The use of about 20 parts by weight or less may help avoid undue reductions in the tensile strength of the film.

The phenol curing agent may be any suitable phenol curing agent. Particularly useful are phenol curing agents having superior electrolytic corrosion resistance upon the absorption of moisture, e.g., bisphenol A-based, bisphenol F-based, and bisphenol S-based curing resins, phenol novolac resins, bisphenol A-based novolac resins, cresol novolac resins, xyloc-based phenol resins, biphenyl-based phenol resins, etc.

Example commercially-manufactured products of the above-described components for the phenol curing agent include the following. For a simple phenolic curing agent, examples include H-1, H-4, HF-1M, HF-3M, HF-4M, and HF-45, all made by Meiwa Plastic Industries, Ltd. (Japan). For a para-xylene based curing agent, examples include MEH-78004S, MEH-7800SS, MEH-7800S, MEH-7800M, MEH-7800H, MEH-7800HH, and MEH-78003H, all made by Meiwa Plastic Industries, Ltd. (Japan), and KPH-F3065, made by Kolon Chemical Co., Ltd (Korea). For a biphenyl based curing agent, examples include MEH-7851SS, MEH-7851 S, MEH7851M, MEH-7851H, MEH-78513H, and MEH-78514H, all made by Meiwa Plastic Industries, Ltd. (Japan), and KPH-F4500, made by Kolon Chemical Co., Ltd (Korea). For a triphenylmethyl based curing agent, examples include MEH-7500, MEH-75003S, MEH-7500SS, MEH-7500S, and MEH-7500H, all made by Meiwa Plastic Industries, Ltd. (Japan). The above-described example commercially-manufactured products for the phenol curing agent may be used alone or in mixtures of two or more.

The phenol curing agent may be used in an amount of about 3 to about 40 parts by weight, based on the total amount of the adhesive film composition. The use of about 3 parts by weight or more of the phenol curing agent may enhance reliability due to a sufficient curing fraction. The use of about 40 parts by weight or less may help avoid undue reductions in the tensile strength of the film.

The latent catalytic curing agent may be a curing agent in which a curing catalyst is chemically or physically introduced to the curing agent, thus enabling storage for a long period of time and promoting the curing reaction in the presence of heat. Exemplary latent catalytic curing agents include those in which a biphenyl-based phenol curing agent or a xylok-based phenol curing agent is introduced with a catalyst of Formula 2 (tetraphenylphosphonium tetraphenylborate) or Formula 3 (triphenylphosphine-1,4-benzoquinone adduct), below:

Typical examples of the latent catalytic curing agent include xylok-based phenols, such as MEH-7800C, and biphenyl-based phenols, such as MEH-7851C, both made by Meiwa Plastic Industries, Ltd. (Japan), which may be used alone or in mixtures of two or more.

The latent catalytic curing agent may be used in an amount of about 3 to about 20 parts by weight, based on the total amount of the adhesive film composition. The use of about 20 parts by weight or less may avoid unduly high curing rates, which could degrade the adhesive properties.

The curing catalyst may function to reduce the curing time, which may help completely cure an epoxy resin during a semiconductor assembly process. The curing catalyst may be any suitable catalyst, e.g., catalysts reactive to melamine-based, imidazole-based, or phenol-based curing agents. Example commercially-manufactured products include imidazole-based catalysts, e.g., Ajicure® PN-23 and PN-40, both made by Ajinomoto Co., Inc. (Japan), and 2P4MZ, 2MA-OK, 2MAOK-PW, and 2P4 MHZ, all made by Shikoku Chemicals Corp. (Japan), which may be used alone or in mixtures of two or more.

The curing catalyst may be used in an amount of about 0.01 to about 20 parts by weight, and preferably about 0.01 to about 5 parts by weight, based on the total amount of the adhesive film composition. The use of about 20 parts by weight or less of the curing catalyst may avoid undue reductions in storage stability.

The silane coupling agent may be an adhesion promoter that enhances the adhesive force between the surface of an inorganic material, e.g. silica, a die or a wafer, and the resin of the adhesive film. Example coupling agents include epoxy-containing 2-(3,4-epoxycyclohexyl)-ethyltrimethoxysilane, 3-glycidoxytrimethoxysilane, 3-glycidoxypropyltriethoxysilane, 3-glycidoxypropyltriethoxysilane, amine group-containing N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethylbutylidene)propylamine, N-phenyl-3-aminopropyltrimethoxysilane, mercapto-containing 3-mercaptopropylmethyldimethoxysilane, 3-mercaptopropyltriethoxysilane, and isocyanate group-containing 3-isocyanatepropyltriethoxysilane, which may be used alone or in mixtures of two or more.

The silane coupling agent may be used in an amount of about 0.01 to about 10 parts by weight, based on the total amount of the adhesive film composition. The use of about 10 parts by weight or less of the silane coupling agent may help avoid reductions in the adhesive force and the tensile strength of the film.

The filler may include an inorganic filler or an organic filler, depending on the particular application. Any suitable filler may be used. The inorganic filler may include metals, e.g., gold powder, silver powder, copper powder, and/or nickel, and non-metals, e.g., alumina, aluminum hydroxide, magnesium hydroxide, calcium carbonate, magnesium carbonate, calcium silicate, magnesium silicate, calcium oxide, magnesium oxide, aluminum oxide, aluminum nitride, silica, boron nitride, titanium dioxide, glass, iron oxide, and/or ceramics. The organic filler may include, e.g., carbon, rubber filler, and/or polymers.

Inorganic fillers such as spherical silica and amorphous silica may be used, which may have a size of about 5 nm to about 10 μm. The use of inorganic fillers having a particle size of about 10 μm or less may help avoid damage to circuits in a semiconductor device.

The filler may be used in an amount of about 0.1 to about 60 parts by weight, based on the total amount of the adhesive film composition. When the adhesive film is used to bond similar chips, the amount of the filler may be about 0.1 to about 30 parts by weight, and when used to bond different chips, the amount of the filler may be about 10 to about 60 parts by weight. The use of about 60 parts by weight or less may help avoid difficulties in film formation and may avoid undue reductions in the tensile strength of the film.

The adhesive film composition may further include an organic solvent, which may decrease the viscosity of the adhesive film composition and facilitate the preparation of a film. The organic solvent may be a suitable solvent such as toluene, xylene, propylene glycol monomethyl ether acetate, benzene, acetone, methylethylketone, tetrahydrofuran, dimethylformamide, or cyclohexanone. The solvent may be a single solvent or a mixture of solvents.

The amount of solvent used is preferably about 5 to about 85 parts by weight, relative to the above-described components of the adhesive film composition. The amount of the organic solvent may be determined depending on the viscosity of the composition. Typically, the amount of organic solvent used may be about 20 to about 60 parts by weight, which may provide a stable film.

The adhesive film composition may further include an ion-capturing agent for neutralizing ionic impurities and improving the reliability of the insulation properties provided by the adhesive film composition. The ion-capturing agent may be any suitable agent, e.g., a triazine thiol compound, a zirconium-based compound, an antimony/bismuth-based compound, or a magnesium/aluminum-based compound.

The ion-capturing agent may be used in an amount of about 0.01 to about 5 parts by weight, based on the total amount of the adhesive film composition. The use of large amounts of the ion-capturing agent may be undesirable, as it may result in the ion-capturing agent itself acting as an impurity.

Embodiments also relate to an adhesive film prepared using the adhesive film composition. The adhesive film may be a partially solidified mixture prepared using the adhesive film composition. The adhesive film may exhibit very good solid-state properties at room temperature, which may facilitate die pick-up from the PSA layer. Furthermore, the flowability may increase at predetermined bonding temperatures such that, upon wafer mounting, e.g., under conditions of 60° C. to 80° C., a strong adhesive force with respect to the wafer may be provided. Further, in the die attachment process, the adhesive film may make a rough surface of an opposing PCB or wafer uniform due to the flowability of the adhesive film, which may help minimize the generation of voids and may effectively enclose wires. Thus, a highly reliable adhesive film for semiconductor assembly may be provided.

Embodiments also relate to a dicing die-bonding film for semiconductor assembly, including the above-described adhesive film. The dicing die-bonding film may minimize the generation of voids in the course of attaching the adhesive film to a back surface of a semiconductor wafer. Embodiments also relate to a die package prepared using the above-described adhesive film, wherein the adhesive film is solidified. Thus, where the dicing die-bonding film is partially solidified during film formation, e.g., by drying, the dicing die-bonding film is solidified, i.e., fully solidified, in the die package, e.g., being solidified during an epoxy molding process.

The following Examples and Comparative Examples are provided in order to set forth particular details of one or more embodiments. However, it will be understood that the embodiments are not limited to the particular details described.

Examples 1-1 to 1-4, 2-1 to 2-4, and Comparative Examples 1 and 2

Figure 2:
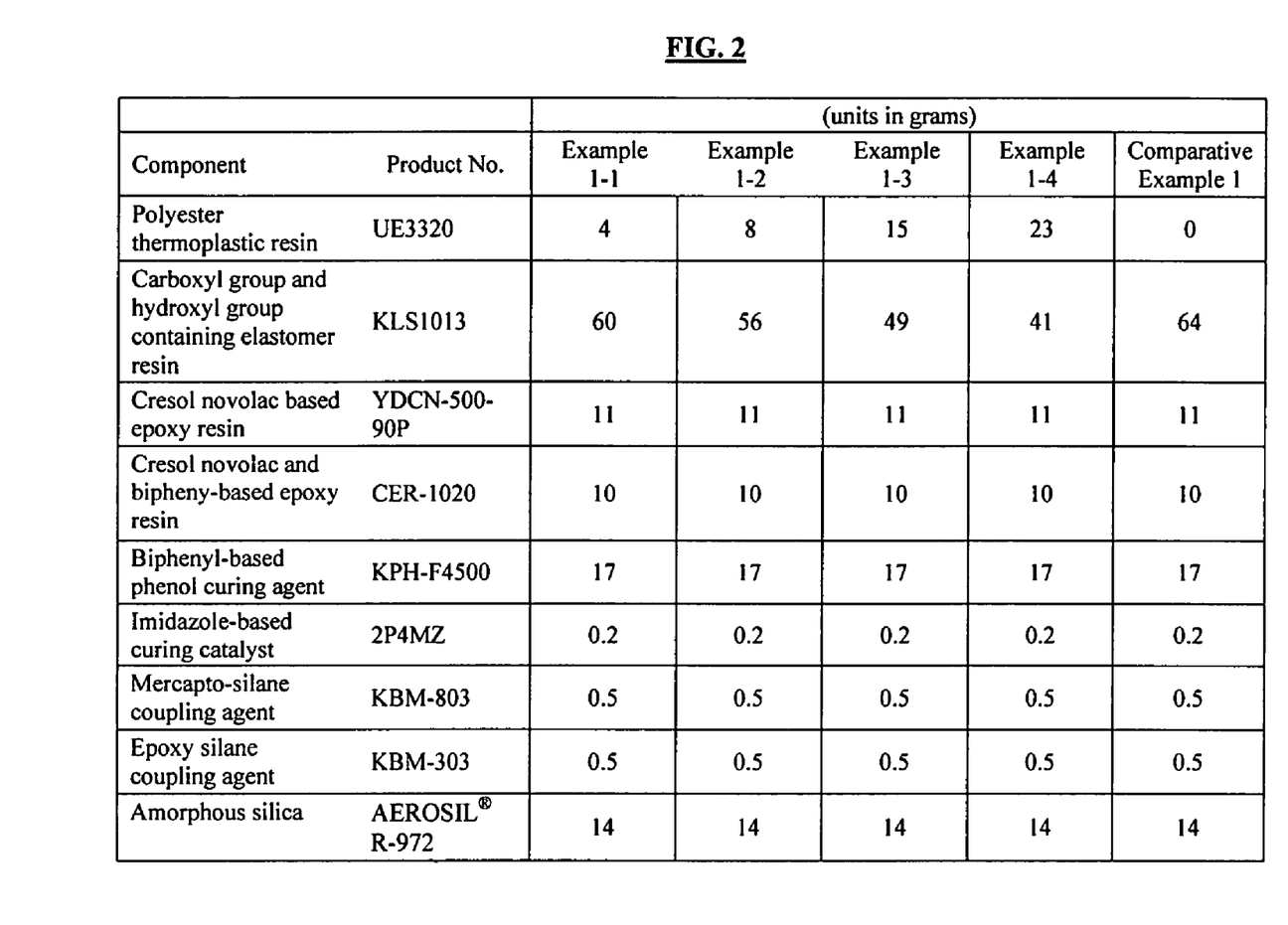
FIG. 2 illustrates a table of components used in Examples 1-1 to 1-4 and Comparative Example 1.

Into a 1 L cylindrical flask provided with a high-speed stirring rod, the components listed below (shown in FIGS. 2 and 3) were added and rapidly dispersed at 4000 rpm for 20 min, thus preparing compositions that were subsequently filtered using a 50 μm capsule filter. Each filtered composition was applied to a thickness of 60 μm using an applicator to prepare an adhesive film, after which the adhesive film was dried at 60° C. for 20 min, further dried at 90° C. for 20 min, and stored at room temperature for one day.

Example 1-1

(a) 4 g of polyester thermoplastic resin (Elitel UE3320, made by Unitika, Ltd. (Japan)), (b) 60 g of carboxyl group and hydroxyl group-containing elastomer resin (KLS-1013, made by Fujikura Kasei Co., Ltd. (Japan)), (c) 11 g of cresol novolac-based epoxy resin (YDCN-500-90P, made by Kukdo Chemical Co., Ltd. (Korea)) and 10 g of cresol novolac and biphenyl-based epoxy resin (CER-1020, made by Nippon Kayaku Co., Ltd. (Japan)), (d) 17 g of biphenyl-based phenol curing agent (KPH-F4500, made by Kolon Chemical Co., Ltd (Korea)), (e) 0.2 g of imidazole-based curing catalyst (2P4MZ, made by Shikoku Chemicals Corp. (Japan)), (f) 0.5 g of mercapto-silane coupling agent (KBM-803, made by Shin-Etsu Chemical Co., Ltd. (Japan)) and 0.5 g of epoxy silane coupling agent (KBM-303, made by Shin-Etsu Chemical Co., Ltd. (Japan)), and (g) 14 g of amorphous silica (AEROSIL® R-972, manufactured by Evonik Degussa GmbH, formerly Degussa GmbH (Germany)).

Example 1-2

(a) 8 g of polyester thermoplastic resin (UE3320), (b) 56 g of carboxyl group and hydroxyl group-containing elastomer resin (KLS-1013), (c) 11 g of cresol novolac-based epoxy resin (YDCN-500-90P) and 10 g of cresol novolac and biphenyl-based epoxy resin (CER-1020), (d) 17 g of biphenyl-based phenol curing agent (KPH-F4500), (e) 0.2 g of imidazole-based curing catalyst (2P4MZ), (f) 0.5 g of mercapto silane coupling agent (KBM-803) and 0.5 g of epoxy silane coupling agent (KBM-303), and (g) 14 g of amorphous silica (AEROSIL® R-972).

Example 1-3

(a) 15 g of polyester thermoplastic resin (UE3320), (b) 49 g of carboxyl group and hydroxyl group-containing elastomer resin (KLS-1013), (c) 11 g of cresol novolac-based epoxy resin (YDCN-500-90P) and 10 g of cresol novolac and biphenyl-based epoxy resin (CER-1020), (d) 17 g of biphenyl-based phenol curing agent (KPH-F4500), (e) 0.2 g of imidazole-based curing catalyst (2P4MZ), (f) 0.5 g of mercapto silane coupling agent (KBM-803) and 0.5 g of epoxy silane coupling agent (KBM-303), and (g) 14 g of amorphous silica (AEROSIL® R-972).

Example 1-4

(a) 23 g of polyester thermoplastic resin (UE3320), (b) 41 g of carboxyl group and hydroxyl group-containing elastomer resin (KLS-1013), (c) 11 g of cresol novolac-based epoxy resin (YDCN-500-90P) and 10 g of cresol novolac and biphenyl-based epoxy resin (CER-1020), (d) 17 g of biphenyl-based phenol curing agent (KPH-F4500), (e) 0.2 g of imidazole-based curing catalyst (2P4MZ), (f) 0.5 g of mercapto silane coupling agent (KBM-803) and 0.5 g of epoxy silane coupling agent (KBM-303), and (g) 14 g of amorphous silica (AEROSIL® R-972).

Example 2-1

(a) 4 g of polyester thermoplastic resin (Adhesion Resin 2440, made by Evonik Degussa GmbH, formerly Degussa GmbH (Germany)), (b) 34 g of carboxyl group and hydroxyl group-containing elastomer resin (SG-708-6, made by Nagase ChemteX Corp. (Japan)), (c) 11 g of cresol novolac-based epoxy resin (YDCN-500-5P, made by Kukdo Chemical Co., Ltd. (Korea)) and 10 g of cresol novolac and biphenyl-based epoxy resin (CER-1020), (d) 15 g of biphenyl-based phenol curing agent (KPH-F4500, made by Kolon Chemical Co., Ltd.), (e) 5 g of xylok-based latent curing catalyst (MEH-7800C, made by Meiwa Plastic Industries), (f) 0.5 g of mercapto silane coupling agent (KBM-803) and 0.5 g of epoxy silane coupling agent (KBM-303), and (g) 34 g of spherical silica filler (PLV-3, made by Tatsumori Ltd.).

Example 2-2

(a) 8 g of polyester thermoplastic resin (Adhesion Resin 2440), (b) 30 g of carboxyl group and hydroxyl group-containing elastomer resin (SG-708-6), (c) 11 g of cresol novolac-based epoxy resin (YDCN-500-5P) and 10 g of cresol novolac and biphenyl-based epoxy resin (CER-1020), (d) 15 g of biphenyl-based phenol curing agent (KPH-F4500), (e) 5 g of xyloc-based latent curing catalyst (MEH-7800C), (f) 0.5 g of mercapto silane coupling agent (KBM-803) and 0.5 g of epoxy silane coupling agent (KBM-303), and (g) 34 g of spherical silica filler (PLV-3).

Example 2-3

(a) 15 g of polyester thermoplastic resin (Adhesion Resin 2440), (b) 23 g of carboxyl group and hydroxyl group-containing elastomer resin (SG-708-6), (c) 11 g of cresol novolac-based epoxy resin (YDCN-500-5P) and 10 g of cresol novolac and biphenyl-based epoxy resin (CER-1020), (d) 15 g of biphenyl-based phenol curing agent (KPH-F4500), (e) 5 g of xyloc-based latent curing catalyst (MEH-7800C), (f) 0.5 g of mercapto silane coupling agent (KBM-803) and 0.5 g of epoxy silane coupling agent (KBM-303), and (g) 34 g of spherical silica filler (PLV-3).

Example 2-4

(a) 23 g of polyester thermoplastic resin (Adhesion Resin 2440), (b) 15 g of carboxyl group and hydroxyl group-containing elastomer resin (SG-708-6), (c) 11 g of cresol novolac-based epoxy resin (YDCN-500-5P) and 10 g of cresol novolac and biphenyl-based epoxy resin (CER-1020), (d) 15 g of biphenyl-based phenol curing agent (KPH-F4500), (e) 5 g of xylok-based latent curing catalyst (MEH-7800C), (f) 0.5 g of mercapto silane coupling agent (KBM-803) and 0.5 g of epoxy silane coupling agent (KBM-303), and (g) 34 g of spherical silica filler (PLV-3).

Comparative Examples 1 and 2

The components of Examples 1-1 and 2-1, other than the polyester-based thermoplastic resin, were used to prepare first and second comparative adhesive film compositions, respectively. Using each composition thus obtained, an adhesive film was prepared. Details of the preparation are set forth below.

Comparative Example 1

(a) 64 g of carboxyl group and hydroxyl group-containing elastomer resin (KLS-1013), (b) 11 g of cresol novolac-based epoxy resin (YDCN-500-90P) and 10 g of cresol novolac and biphenyl-based epoxy resin (CER-1020), (c) 17 g of biphenyl-based phenol curing agent (KPH-F4500), (d) 0.2 g of imidazole-based curing catalyst (2P4MZ), (e) 0.5 g of mercapto silane coupling agent (KBM-803) and 0.5 g of epoxy silane coupling agent (KBM-303), and (f) 14 g of amorphous silica (AEROSIL® R-972).

Comparative Example 2

(a) 38 g of carboxyl group and hydroxyl group-containing elastomer resin (SG-708-6), (b) 11 g of cresol novolac-based epoxy resin (YDCN-500-5P) and 10 g of cresol novolac and biphenyl-based epoxy resin (CER-1020), (c) 15 g of biphenyl-based phenol curing agent (KPH-F4500), (d) 5 g of xyloc-based latent curing catalyst (MEH-7800C), (e) 0.5 g of mercapto silane coupling agent (KBM-803) and 0.5 g of epoxy silane coupling agent (KBM-303), and (f) 34 g of spherical silica filler (PLV-3).

Evaluation of Properties of Adhesive Films of Examples and Comparative Examples

Figure 4:
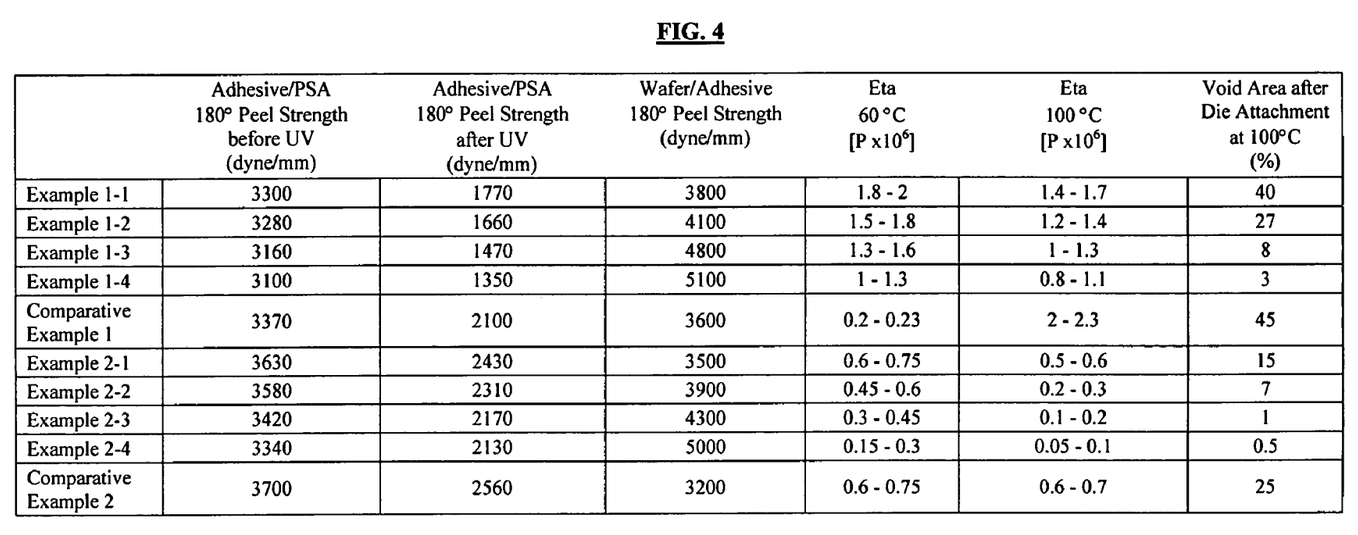
FIG. 4 illustrates results of testing of Examples 1-1 to 1-4 and 2-1 to 2-4, and Comparative Examples 1 and 2.

The properties of the adhesive films of each of Examples 1-1 to 1-4 and 2-1 to 2-4 and Comparative Examples 1 and 2 were evaluated as follows. The results are shown in FIG. 4. In order to estimate the pick-up success rate, 180° peel strength between the adhesive layer and the PSA layer, before and after the UV radiation in FIG. 4, were determined. The results are also shown in FIG. 4.

(1) 180° Peel Strength (Between Adhesive Layer and PSA Layer)

To determine the adhesive force between the adhesive films and a PSA layer, the adhesive films were laminated to a dicing film at room temperature (25° C.), left for 1 hour, and then measured for 180° peel strength using a 15 mm×70 mm-sized rectangular film. The dicing film was fabricated by coating a 10 μm-thick layer of UV-curable PSA on a polyolefin film having a thickness of 100 μm. The tack value of the dicing film was 130 gf before UV curing and 60 gf after UV curing. When applied to a sample composed of stainless (SUS 304), before UV curing, the 180° peel value of the dicing film was 300 dyne/mm, and after UV curing, the 180° peel value of the dicing film was 900 dyne/mm.

(2) 180° Peel Strength (Between Adhesive Layer and Wafer)

To determine adhesive force between a wafer and the adhesive films, each film was formed at room temperature (25° C.), left for 1 hour, laminated with a 25 mm×70 mm-sized wafer (720 μm thick) at 60° C., using a roll pressure of 0.2 MPa and velocity of 20 m/s, and measured for 180° peel strength.

(3) Viscosity

Figure 3:
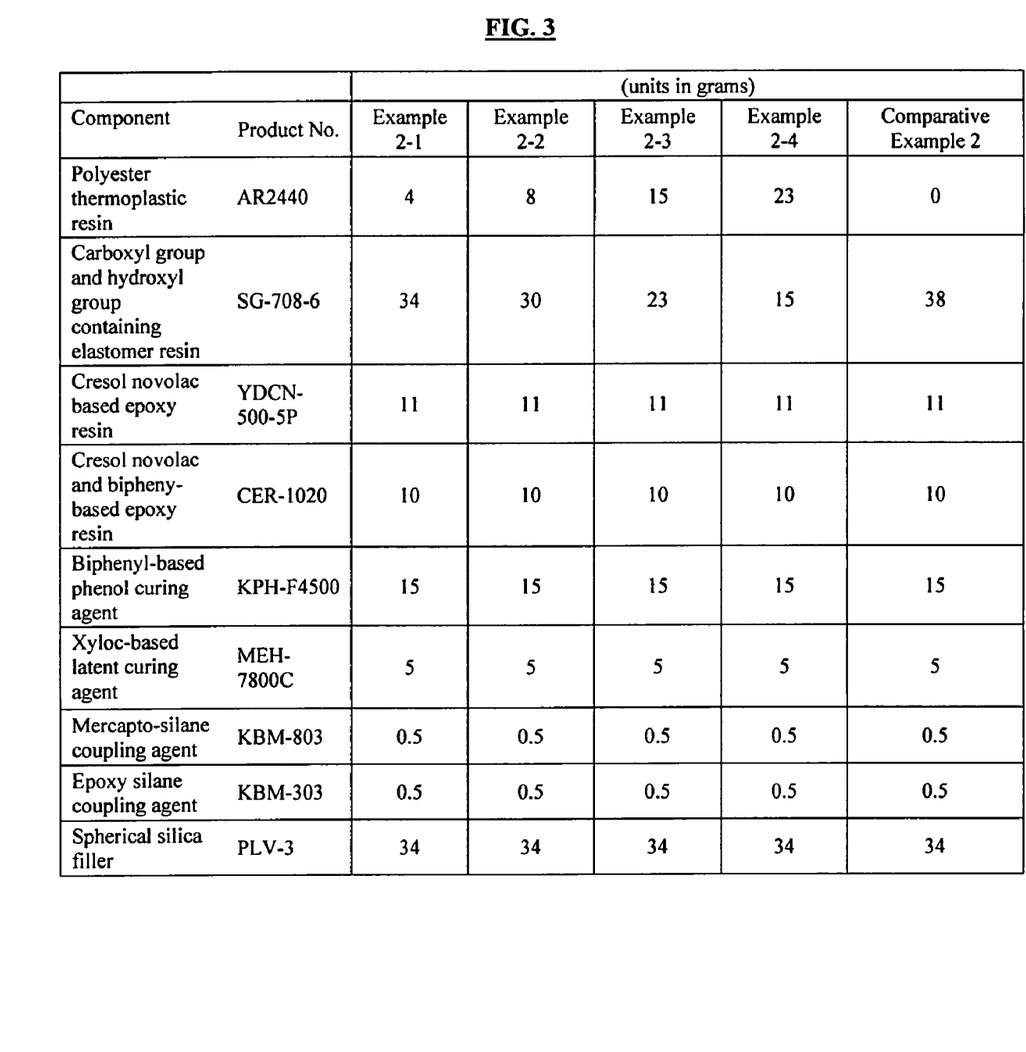
FIG. 3 illustrates a table of components used in Examples 2-1 to 2-4 and Comparative Example 2.

To determine the viscosity of the adhesive film, each film was laminated as four layers at 60° C. and cut in a circular shape having a diameter of 8 mm. The thickness of the adhesive film was about 200 μm to about 240 μm. The viscosity was measured in a range of 30° C. to 100° C. with a heating rate of 5° C./min. In FIG. 3, the 60° C. viscosity (η, eta) value may be used for estimating the adhesive force between the wafer and the adhesive film in a wafer mounting process, and the 100° C. eta value may be used for estimating flowability at temperatures for die attachment. The eta value at 100° C. indicates that the flowability of the film would increase on the chip to be assembled in the die attachment process, which may inhibit the generation of voids and may help effectively enclose wires with the film.

(4) Voiding after Die Attachment

A wafer (720 μm thick and coated with a dioxide film) was cut to a size of 5 mm×5 mm, laminated with the respective adhesive films at 60° C., and cut except for the adhered portion. Another wafer having a thickness of 720 μm and a size of 10 mm×10 mm was placed on a hot plate having a temperature of 100° C. The wafer piece laminated with respective adhesive film was attached to the 10 mm×10 mm wafer. The two wafers were then pressed by a force of 1 kg·f for 20 seconds, and then completely cured at 125° C. for 1 hr then 175° C. for 3 hr. Then, the state of voiding of the adhesive film between wafers was observed using a scanning acoustic tomograph (SAT).

As shown in FIG. 4, the adhesive films of Examples 1-1 to 1-4 and 2-1 to 2-4, having the polyester-based thermoplastic resin, exhibited decreased 180° peel strength between the adhesive layer and the PSA layer both before and after UV curing, as compared to the adhesive films of Comparative Examples 1 and 2 that did not have a polyester-based thermoplastic resin. As the amount of the polyester-based thermoplastic resin was increased, the 180° peel strength was further decreased. This is believed to be due to the film containing the polyester-based thermoplastic resin exhibiting solid-state properties at room temperature, which means that the hardness of the outer surface of the film is increased when the amount of the thermoplastic resin is higher. Hence, upon semiconductor pick-up, the degree of adhesion to the PSA layer is decreased and results in increased pick-up success rates.

In order to realize a high pick-up success rate, the adhesive force between the adhesive layer and the wafer should be greater than the adhesive force between the adhesive layer and the PSA layer. Further, as the difference of 180° peel strength between before and after UV irradiation is increased, the pick-up success rate may improve. As shown in FIG. 4, the adhesive films having the polyester-based thermoplastic resin in Examples 1-1 to 1-4 and 2-1 to 2-4 were increased in 180° peel strength between the adhesive layer and the wafer, as compared to the adhesive films that did not have polyester-based thermoplastic resin in Comparative Examples 1 and 2. When the amount of the polyester-based thermoplastic resin was increased, the 180° peel strength was further increased. This is believed to be due to the eta value corresponding to the viscosity at 60° C. for the wafer mounting in FIG. 4 being significantly decreased due to the polyester-based thermoplastic resin in the adhesive film, thus increasing the wettability of the wafer and increasing the adhesive force to the wafer, and consequently positively affecting the pick-up success rate.

As is apparent from FIG. 4, the adhesive films having the polyester-based thermoplastic resin in Examples 1-1 to 1-4 and 2-1 to 2-4 were remarkably decreased in eta value for the viscosity at 100° C. representing die attachment, and in the tendency to form voids, as compared to the adhesive films having no polyester-based thermoplastic resin in Comparative Examples 1 and 2. The resins having no polyester-based thermoplastic resin exhibited very low changes in viscosity from 60° C. upwards, exhibited low flowability, and generated voids. In contrast, in resins having the polyester-based thermoplastic resin, as in Examples 1-1 to 1-4 and 2-1 to 2-4, the degree of decrease in viscosity was greater, and fewer voids were generated.

As described herein, example embodiments provide an adhesive film composition and an adhesive film prepared using the same. The adhesive film composition includes a polyester-based thermoplastic resin, and thus the adhesive film exhibits superior solid-state properties at room temperature, i.e., become harder and decrease the adhesive force to the PSA layer. Because the flowability of the film is very good at a predetermined bonding temperature, e.g., at about 50° C. to about 80° C., the viscosity of the film may be significantly decreased upon wafer mounting, therefore increasing the adhesive force with respect to the wafer. Further, in the semiconductor assembly process, the pick-up success rate, which is affected by the level of adhesion between the adhesive layer and the PSA layer, may be increased due to the hardness of the surface of the film. Furthermore, the film may exhibit high flowability at high temperatures, thus providing superior results with respect to a rough surface of a substrate, the film becoming uniform upon die attachment and minimizing voids occurring upon die attachment at high temperatures. Further, a rough surface of, e.g., a PCB or wired device, may be effectively enclosed to provide an adhesive film for semiconductor assembly that exhibits high reliability and processability.

Example embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An adhesive film composition, comprising:
a polyester-based thermoplastic resin;
an elastomer resin containing at least one of a hydroxyl group, a carboxyl group, or an epoxy group;
an epoxy resin;
a phenol curing agent;
at least one of a latent catalytic curing agent or a curing catalyst;
a silane coupling agent; and
a filler, the polyester-based thermoplastic resin being a homopolymer or copolymer represented by the following Formula 1:

(1)

wherein:
n is an integer such that the polyester-based thermoplastic resin has a weight average molecular weight of about 200 to about 1,000,000,
$R_1$ is an oxalic group, a succinyl group, a terephthalic group, an isophthalic group, a naphthalene group, a diphenyl group, a diphenoxyethene group, a diphenylsulfone group, an alkyl group, a benzoic group, a cycloalkyl group, or a benzene group,
$R_2$ is an alkyl group, a naphthalene group, a hydroquinone group, a benzene group, or a phenyl group, and
$R_1$ and $R_2$ are independently substituted or unsubstituted.

2. The composition as claimed in claim 1, wherein the polyester-based thermoplastic resin has a softening point of about 0° C. to about 200° C.

3. The composition as claimed in claim 2, wherein the polyester-based thermoplastic resin has a softening point of about 30° C. to about 140° C.

4. The composition as claimed in claim 1, wherein the elastomer resin has a weight average molecular weight ranging from about 500 to about 5,000,000.

5. The composition as claimed in claim 1, wherein the epoxy resin includes one or more of a bisphenol-based epoxy, a phenol novolac-based epoxy, an o-cresol novolac-based epoxy, a multifunctional epoxy resin, an amine-based epoxy, a heterocyclic ring-containing epoxy, a substituted epoxy, a naphthol-based epoxy, or derivatives thereof.

6. The composition as claimed in claim 5, wherein the phenol curing agent includes one or more of a phenol novolac-based resin, a phenol aralkyl-based resin, a bisphenol A-based novolac resin, or a cresol-based novolac resin.

7. The composition as claimed in claim 6, wherein:
the composition includes the latent catalytic curing agent, and
the latent catalytic curing agent includes a biphenyl-based phenol curing agent or a phenol aralkyl-based phenol curing agent, and a catalyst represented by Formula 2 or 3:

(2)

(3)

8. The composition as claimed in claim 6, wherein:
the composition includes the curing catalyst, and
the curing catalyst includes one or more of a melamine-based curing catalyst, an imidazole-based curing catalyst, or a phenol-based curing catalyst.

9. The composition as claimed in claim 1, wherein the silane coupling agent includes one or more of an epoxy-containing silane or a mercapto-containing silane.

10. The composition as claimed in claim 9, wherein the filler has a size ranging from about 5 nm to about 10 μm.

11. The composition as claimed in claim 1, wherein, based on a total amount of the adhesive film composition exclusive of any solvent:
the polyester-based thermoplastic resin is included in an amount of about 1 to about 50 parts by weight,
the elastomer resin is included in an amount of about 5 to about 75 parts by weight,
the epoxy resin is included in an amount of about 3 to about 20 parts by weight,
the phenol curing agent is included in an amount of about 3 to about 40 parts by weight,
the latent catalytic curing agent is included in an amount of about 3 to about 20 parts by weight,
the silane coupling agent is included in an amount of about 0.01 to about 10 parts by weight, and
the filler is included in an amount of 0.1 to 60 parts by weight.

12. The composition as claimed in claim 11, further comprising about 5 to about 85 parts by weight of an organic solvent.

13. The composition as claimed in claim 11, further comprising about 0.01 to about 5 parts by weight of an ion-capturing agent, wherein the ion-capturing agent includes one or more of a triazine thiol compound, a zirconium-based compound, an antimony bismuth-based compound, or a magnesium aluminum-based compound.

14. The composition as claimed in claim 1, wherein, based on a total amount of the adhesive film composition exclusive of any solvent:
the polyester-based thermoplastic resin is included in an amount of about 1 to about 50 parts by weight,
the elastomer resin is included in an amount of about 5 to about 75 parts by weight,
the epoxy resin is included in an amount of about 3 to about 20 parts by weight,
the phenol curing agent is included in an amount of about 3 to about 40 parts by weight,
the curing catalyst is included in an amount of about 0.01 to about 5 parts by weight,
the silane coupling agent is included in an amount of about 0.01 to about 10 parts by weight, and
the filler is included in an amount of 0.1 to 60 parts by weight.

15. The composition as claimed in claim 14, further comprising about 5 to about 85 parts by weight of an organic solvent.

16. The composition as claimed in claim 14, further comprising about 0.01 to about 5 parts by weight of an ion-capturing agent, wherein the ion-capturing agent includes one or more of a triazine thiol compound, a zirconium-based compound, an antimony bismuth-based compound, or a magnesium aluminum-based compound.

17. The composition as claimed in claim 1, wherein, based on a total amount of the adhesive film composition exclusive of any solvent:
the polyester-based thermoplastic resin is included in an amount of about 1 to about 50 parts by weight,
the elastomer resin is included in an amount of about 5 to about 75 parts by weight,
the epoxy resin is included in an amount of about 3 to about 20 parts by weight,
the phenol curing agent is included in an amount of about 3 to about 40 parts by weight,
the latent catalytic curing agent is included in an amount of about 3 to about 20 parts by weight,
the curing catalyst is included in an amount of about 0.01 to about 5 parts by weight,
the silane coupling agent is included in an amount of about 0.01 to about 10 parts by weight, and
the filler is included in an amount of 0.1 to 60 parts by weight.

18. An adhesive film, comprising a partially solidified mixture that includes:
a polyester-based thermoplastic resin;
an elastomer resin containing at least one of a hydroxyl group, a carboxyl group, or an epoxy group;
an epoxy resin;
a phenol curing agent;
at least one of a latent catalytic curing agent or a curing catalyst;
a silane coupling agent; and
a filler, the polyester-based thermoplastic resin being a homopolymer or copolymer represented by the following Formula 1:

wherein:
n is an integer such that the polyester-based thermoplastic resin has a weight average molecular weight of about 200 to about 1,000,000,
$R_1$ is an oxalic group, a succinyl group, a terephthalic group, an isophthalic group, a naphthalene group, a diphenyl group, a diphenoxyethene group, a diphenylsulfone group, an alkyl group, a benzoic group, a cycloalkyl group, or a benzene group,
$R_2$ is an alkyl group, a naphthalene group, a hydroquinone group, a benzene group, or a phenyl group, and
$R_1$ and $R_2$ are independently substituted or unsubstituted.

19. A dicing die-bonding film, comprising:
a dicing film;
an adhesive film; and
a pressure sensitive adhesive layer, wherein:
the pressure sensitive adhesive layer is disposed between the adhesive film and the dicing film, and
the adhesive film includes a partially solidified mixture having:
a polyester-based thermoplastic resin;
an elastomer resin containing at least one of a hydroxyl group, a carboxyl group, or an epoxy group;
an epoxy resin;
a phenol curing agent;
at least one of a latent catalytic curing agent or a curing catalyst;
a silane coupling agent; and
a filler, the polyester-based thermoplastic resin being a homopolymer or copolymer represented by the following Formula 1:

wherein:
n is an integer such that the polyester-based thermoplastic resin has a weight average molecular weight of about 200 to about 1,000,000,
$R_1$ is an oxalic group, a succinyl group, a terephthalic group, an isophthalic group, a naphthalene group, a diphenyl group, a diphenoxyethene group, a diphenylsulfone group, an alkyl group, a benzoic group, a cycloalkyl group, or a benzene group,
$R_2$ is an alkyl group, a naphthalene group, a hydroquinone group, a benzene group, or a phenyl group, and
$R_1$ and $R_2$ are independently substituted or unsubstituted.

20. A die package, comprising:
a die;
an adhesive film; and
a substrate, the adhesive film being disposed between the die and the substrate, wherein the adhesive film includes a solidified mixture of:
a polyester-based thermoplastic resin;
an elastomer resin containing at least one of a hydroxyl group, a carboxyl group, or an epoxy group;

an epoxy resin;
a phenol curing agent;
at least one of a latent catalytic curing agent or a curing catalyst;
a silane coupling agent; and
a filler, the polyester-based thermoplastic resin being a homopolymer or copolymer represented by the following Formula 1:

(1)

wherein:

n is an integer such that the polyester-based thermoplastic resin has a weight average molecular weight of about 200 to about 1,000,000, $R_1$ is an oxalic group, a succinyl group, a terephthalic group, an isophthalic group, a naphthalene group, a diphenyl group, a diphenoxyethene group, a diphenylsulfone group, an alkyl group, a benzoic group, a cycloalkyl group, or a benzene group, $R_2$ is an alkyl group, a naphthalene group, a hydroquinone group, a benzene group, or a phenyl group, and $R_1$ and $R_2$ are independently substituted or unsubstituted.

* * * * *